United States Patent
Costrini et al.

(10) Patent No.: US 7,875,550 B2
(45) Date of Patent: Jan. 25, 2011

(54) METHOD AND STRUCTURE FOR SELF-ALIGNED DEVICE CONTACTS

(75) Inventors: Gregory Costrini, Hopewell Junction, NY (US); David M. Fried, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 12/110,465

(22) Filed: Apr. 28, 2008

(65) Prior Publication Data

US 2008/0233743 A1 Sep. 25, 2008

Related U.S. Application Data

(62) Division of application No. 11/460,010, filed on Jul. 26, 2006, now Pat. No. 7,470,615.

(51) Int. Cl.
*H01L 21/4763* (2006.01)
(52) U.S. Cl. .............. 438/637; 438/638; 438/640; 438/675; 257/E21.577
(58) Field of Classification Search .......... 438/597, 438/622, 637, 638, 640, 675; 257/E21.577
See application file for complete search history.

(56) References Cited

U.S. PATENT DOCUMENTS

| | | | |
|---|---|---|---|
| 6,057,581 A | 5/2000 | Doan | |
| 6,248,643 B1 | 6/2001 | Hsieh et al. | |
| 6,284,641 B1 | 9/2001 | Parekh | |
| 7,078,758 B2 | 7/2006 | Shinkawata | |
| 7,315,051 B2 | 1/2008 | Cheng | |
| 2001/0001717 A1 | 5/2001 | Kumauchi et al. | |
| 2002/0146904 A1 | 10/2002 | Buynoski et al. | |
| 2004/0043517 A1* | 3/2004 | Sashida | 438/3 |
| 2004/0164418 A1 | 8/2004 | Sugiura et al. | |
| 2005/0003308 A1 | 1/2005 | Frohlich et al. | |
| 2006/0226461 A1 | 10/2006 | Shinkawata | |
| 2007/0224810 A1 | 9/2007 | Graf | |

FOREIGN PATENT DOCUMENTS

JP 2004128188 A 4/2004

OTHER PUBLICATIONS

Costrini et al., U.S. Appl. No. 12/194,563, Office Action Communication, Jan. 6, 2010, 7 pages.

* cited by examiner

*Primary Examiner*—Jack Chen
(74) *Attorney, Agent, or Firm*—Gibb I.P. Law Firm, LLC; Yuanmin Cai, Esq.

(57) ABSTRACT

Disclosed are embodiments of a semiconductor structure with a partially selfaligned contact in lower portion of the contact is enlarged to reduce resistance without impacting device yield. Additionally, the structure optionally incorporates a thick middle-of-the-line (MOL) nitride stress film to enhance carrier mobility. Embodiments of the method of forming the structure comprise forming a sacrificial section in the intended location of the contact. This section is patterned so that it is self-aligned to the gate electrodes and only occupies space that is intended for the future contact. Dielectric layer(s) (e.g., an optional stress layer followed by an interlayer dielectric) may be deposited once the sacrificial section is in place. Conventional contact lithography is used to etch a contact hole through the dielectric layer(s) to the sacrificial section. The sacrificial section is then selectively removed to form a cavity and the contact is formed in the cavity and contact hole.

18 Claims, 8 Drawing Sheets

METHOD AND STRUCTURE FOR SELF-ALIGNED DEVICE CONTACTS

CROSS-REFERENCE TO RELATED APPLICATIONS

This application is a division of U.S. application Ser. No. 11/460,010 filed Jul. 26, 2006, the complete disclosure of which, in its entirety, is herein incorporated by reference.

BACKGROUND

1. Technical Field

The present disclosure relates generally to semiconductor structure design and fabrication and, more particularly, to a semiconductor structure with self-aligned device contacts and a method of forming the semiconductor structure.

2. Description of the Related Art

As device densities within semiconductor structures increase, overlay tolerances between contact (e.g., source/drain contact) and gate lithography levels are difficult to achieve. As a result source/drain contact sizes are reduced (i.e., the contact diameter is scaled) to ensure that the contacts do not short the source/drain diffusion region to the gate electrode. In particular, reducing the contact sizes avoids forming the contacts through the gate sidewall spacers and, thereby, contacting unsilicided active silicon (e.g., a source/drain extension) and severely degrading external resistance. However, scaling the contact size substantially increases the resistance of the contact. Therefore, there is a need in the art for a semiconductor structure with a device contact that provides optimal resistance without impacting device yield.

SUMMARY

In view of the foregoing, disclosed are embodiments of a semiconductor structure having a partially self-aligned device contact that provides optimal resistance without impacting device yield. An additional embodiment of the structure incorporates a thick middle-of-the-line (MOL) stress layer to provide optimal carrier mobility within the device. Also, disclosed are embodiments of a method of forming the structure.

Each embodiment of the semiconductor structure of the present disclosure comprises two parallel gate electrodes (i.e., gate electrode lines) on a semiconductor substrate, sidewall spacers adjacent to the gate electrodes, a silicide region on the semiconductor substrate between the gate electrodes and at least one dielectric layer over the gate electrodes.

A contact connects to the silicide region through the dielectric layer(s). This contact comprises a self-aligned lower portion and an upper portion. In particular, the lower portion extends between and follows the contours of the sidewall spacers that are adjacent to the gate electrodes in order to maximize the contact area between the contact and the silicide region. The upper portion of the contact extends through the dielectric layer(s) to the lower portion. This upper portion is narrower than the lower portion, and particularly, narrower than the top surface of the lower portion.

The sidewall spacers are positioned adjacent to each of the gate electrodes in order to isolate the contact from the gate electrodes. These sidewall spacers may be tapered towards the top of the electrodes. Such tapered sidewall spacers allow the top surface of the self-aligned lower portion of the contact to be formed wider than the bottom surface.

In each embodiment of the present disclosure the upper portion of the contact extends through at least one dielectric layer to the lower portion. For example, in one embodiment the structure can comprise a single dielectric layer above the gate electrodes and the lower portion of the contact. In another embodiment, the structure can comprise both a dielectric stress layer above the gate electrodes and the lower portion of the contact and another dielectric layer above the stress layer. Thus, in this particular embodiment, the upper portion of the contact extends through both the dielectric layer and the dielectric stress layer to the lower portion. This stress layer can comprise a compressive nitride layer, a tensile nitride layer, or a dual-strain nitride layer and is used to optimize carrier mobility within devices (e.g., transistors).

Embodiments of the method of forming the semiconductor structures described above comprise first forming at least two gate electrodes (i.e., gate electrode lines) separated by a gap on a semiconductor substrate. Sidewall spacers (e.g., oxide and/or nitride sidewall spacers) are formed adjacent to the gate electrodes. Particularly, tapered sidewall spacers may be formed so that the lower portion of the contact, which is subsequently formed between these sidewall spacers using a self-aligned process (see discussion below), will be formed with a wider top surface than bottom surface. A silicide region is then formed on the semiconductor substrate in the gap between the gate electrodes. In particular, the silicide region is formed (e.g., using conventional silicide formation processes) on the exposed portion of the semiconductor substrate that extends between the sidewall spacers that are adjacent to each of the gate electrodes.

Once the silicide region is formed, a sacrificial section is formed adjacent to the sidewall spacers in the gap between the gate electrodes in the desired location for the contact. This sacrificial section may be formed by filling the gap between the electrodes with a sacrificial material that has a very high etch selectivity to the materials used to form the spacers and the subsequently formed dielectric layer(s). For example, the sacrificial material may be a low-k constant (i.e., k<3) dielectric material (e.g., SiLK™) that has a very high etch selectivity to nitrides and/or oxides. The sacrificial material may be deposited, spun-on, etc. The sacrificial material may be self-planarizing or may be planarized and/or recessed so that that the top surface of the sacrificial material is level with or below the top of the gate electrodes. Once the gap is filled, the sacrificial material is patterned (e.g., lithographically patterned) in order to form the sacrificial section in the location of the semiconductor structure where the contact is to be positioned. This sacrificial material is particularly patterned so that the sacrificial section extends between the sidewall spacers and is perpendicular to the gate electrodes and so that portions of the semiconductor substrate on either side of the sacrificial section are exposed.

After the sacrificial material is patterned to form the sacrificial section, at least one dielectric layer is formed over the gate electrodes, the sacrificial section and the exposed portions of the semiconductor substrate. In particular, in one embodiment a single dielectric layer is formed over the gate electrodes, the sacrificial section and the exposed portions of the semiconductor substrate. In another embodiment, an optional dielectric stress layer is formed over the gate electrodes, the sacrificial section and the exposed portions of the semiconductor substrate and, then, another dielectric layer is formed over the optional dielectric stress layer. Forming the optional dielectric stress layer may be accomplished using known techniques to form a compressive nitride layer, a tensile nitride layer, or a dual-strain nitride layer in order to optimize carrier mobility for particular devices in the semiconductor substrate.

After forming the dielectric layer(s), a contact hole is patterned (e.g., using conventional contact lithography) and etched (e.g., by a reactive ion etching (RIE) process) through the dielectric layer(s) to the top surface of the sacrificial section. The contact hole may be particularly patterned so that it is narrower than the sacrificial section. Thus, the sacrificial section creates a landing pad for the contact hole etch process that is wider than the contact hole and thereby provides a greater tolerance for over etching. If multiple dielectric layers (e.g., a dielectric stress layer and another dielectric layer) were previously formed, this etching process may require multiple stages designed to selectively etch each of the dielectric layers.

Once the top surface of the sacrificial section is exposed, the sacrificial section is selectively removed to form a cavity and expose the silicide region without removing or damaging the surrounding dielectrics (e.g., the dielectric materials used to form the sidewall spacers and the dielectric layer(s). For example, if SiLK™ is used to form the sacrificial section, the sacrificial section may be ashed out using a selective plasma etch process.

Once the silicide region is exposed, the contact is formed by forming an optional conductive contact liner (e.g., a titanium nitride liner) against the outer surfaces of the cavity and against the sidewalls of the contact hole. Then, a conductive fill material (e.g., a metal, such as tungsten or copper) is deposited through the contact hole until the cavity and contact hole are filled. Thus, a lower self-aligned portion of the contact is formed on the silicide region between sidewall spacers that are adjacent to each of the gate electrodes and an upper portion is formed within the contact hole above the lower portion.

These, and other, aspects and objects of the present disclosure will be better appreciated and understood when considered in conjunction with the following description and the accompanying drawings. It should be understood, however, that the following description, while indicating embodiments of the present disclosure and numerous specific details thereof, is given by way of illustration and not of limitation. Many changes and modifications may be made within the scope of the present disclosure without departing from the spirit thereof.

BRIEF DESCRIPTION OF THE DRAWINGS

The disclosure will be better understood from the following detailed description with reference to the drawings, in which.

DETAILED DESCRIPTION OF PREFERRED EMBODIMENTS

Figure 1:
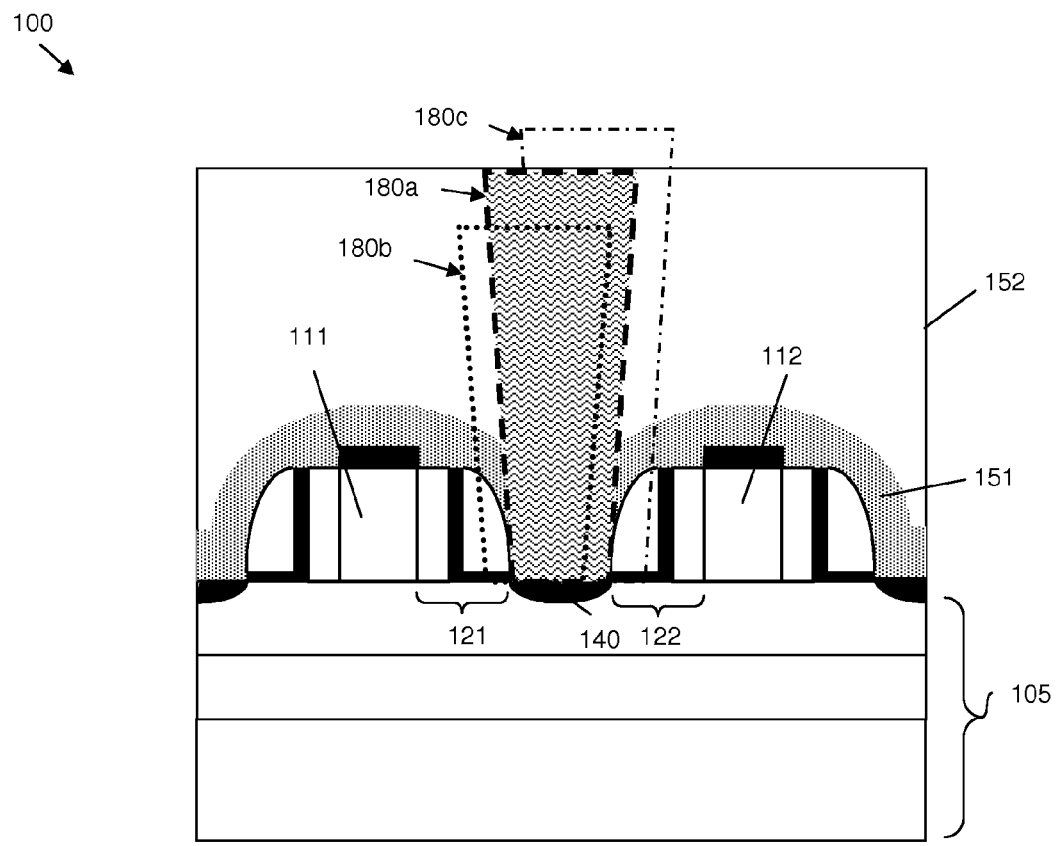
FIG. 1 is a schematic diagram illustrating a cross-sectional view of a semiconductor structure having potential contact profiles achievable using conventional contact lithography, in accordance with one embodiment of the present disclosure.

The present disclosure and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of wellknown components and processing techniques are omitted so as to not unnecessarily obscure the present disclosure. The examples used herein are intended merely to facilitate an understanding of ways in which the present disclosure may be practiced and to further enable those of skill in the art to practice the present disclosure. Accordingly, the examples should not be construed as limiting the scope of the present disclosure.

Referring to FIG. 1, a semiconductor structure of the present disclosure is illustrated and is designated generally as structure 100. As device densities within semiconductor structure 100 increase, overlay tolerances between contact (e.g., source/drain contact 180) and gate 111-112 lithography levels are difficult to achieve. In particular, when using conventional contact lithography there is a margin of error in the placement of the contact hole 180a directly above the silicide region 140. When the contact hole is etched (e.g., by using a reactive ion etching (RIE) process), lack of selectivity in the RIE process in combination with this margin of error, may cause the contact hole to punch through the dielectric spacers 121 or 122 on either side of the silicide region 140 (e.g., see potential contact profiles 180b and 180c). Consequently, when the contact is formed it may contact unsilicided active silicon in a substrate 105 and, thereby, degrade device performance. In order to compensate for this margin of error and lack of selectivity in the RIE process, source/drain contact sizes are often reduced (i.e., the contact diameter is scaled) so as to ensure that the contacts do not short the source/drain diffusion region to the gate electrode 111, 112. However, scaling the contact size substantially decreases the contact area between the contact and the silicide region and increases the resistance of the contact. Therefore, there is a need in the art for a semiconductor structure with a device contact that provides optimal resistance without impacting device yield.

In view of the foregoing, embodiments of a semiconductor structure are disclosed having a partially self-aligned device contact in which the bottom diameter of the contact is significantly enlarged to maximize the contact area between the contact and the silicide region and to minimize contact resistance. Since the contact is self-aligned to gate electrodes, the size expansion does not intrinsically impact device yield. Additionally, an embodiment of the present disclosure also allows for the integration of a thick middle-of-the-line (MOL) nitride stress film to enhance carrier mobility in the devices within the semiconductor structure. Embodiments of the method of forming the structure of the present disclosure comprise forming a sacrificial section (i.e., a disposable plug) in the intended location of the contact. This plug is patterned so that it is self-aligned to the gate electrodes and only occupies space that is intended for the future contact. Dielectric layer(s) (e.g., an optional nitride stress layer followed by an interlayer dielectric) may be deposited once the plug is in place. Conventional contact lithography is used to etch a contact hole through the dielectric layer(s) to the sacrificial section. The sacrificial section is, then, selectively removed and the contact is formed therein.

Figure 2:
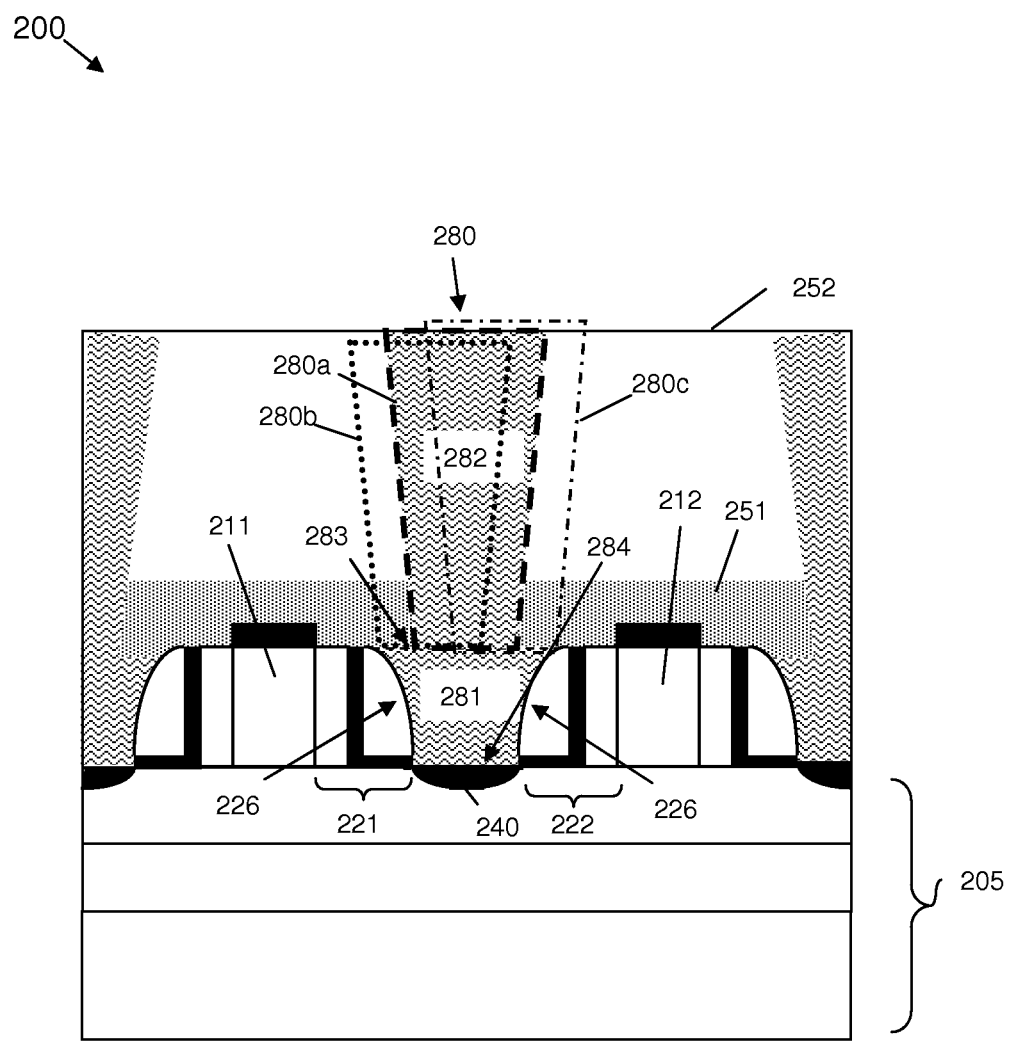
FIG. 2 is a schematic diagram similar to FIG. 1 illustrating a cross-sectional view of the embodiment of the semiconductor structure of FIG. 1.

Referring to FIG. 2, embodiments of a semiconductor structure 200 of the present disclosure is illustrated and comprises at least two parallel gate electrodes 211, 212 (i.e., parallel gate electrode lines) on a semiconductor substrate 205 (e.g., a bulk wafer, an SOI wafer, etc.), sidewall spacers 221, 222 adjacent to each of the gate electrodes 211, 212, a silicide region 240 on the semiconductor substrate 205 between the gate electrodes 211, 212 and at least one dielectric layer 251, 252 over the gate electrodes 211, 212.

In one embodiment, the parallel gate electrodes 211, 212 and the semiconductor substrate 205 may be designed and configured to form multiple transistors for dense multitransistor devices, such as, for example, static random access memory (SRAM) cells, complementary metal oxide semiconductor (CMOS) devices, or similar devices that have a minimum contacted pitch.

With continued reference to FIG. 2, a contact 280 connects to the silicide region 240 through the dielectric layer(s) 252, 251. This contact 280 comprises a lower portion 281 and an upper portion 282. The lower portion 281 is below the dielectric layer(s) 251, 252 and has a bottom surface 284 that is adjacent to the silicide region 240 and a top surface 283 that is adjacent to the upper portion 282. In addition, the lower portion 281 of the contact is selfaligned between the gate electrodes 211, 212. In particular, the lower portion 281 extends between and follows the contours 226, 227 of the sidewall spacers 221 and 222, respectively, that are adjacent to the gate electrodes 211, 212, respectively, so as to maximize the contact area between the contact 280 and the silicide region 240. In one embodiment, the lower portion 281 and particularly, the bottom surface 284 of the lower portion 281 may be formed such that it is wider than the gate electrodes 211, 212.

The upper portion 282 of the contact 280 extends through the dielectric layer(s) 251, 252 to the lower portion 281 and is narrower than the lower portion 281. In particular, the bottom surface of the upper portion 282 is narrower than the adjacent top surface 283 of the lower portion 281. In one embodiment, the upper portion 282 may be centered directly above the lower portion 281 and the silicide region 240, as illustrated in contact hole profile 280a. Alternatively, due to the separate processes used to form the lower and upper portions 281, 282 (described below) which result in the upper portion 282 being narrower than the lower portion 281, the upper portion 282 may be offset slightly to either side (e.g., see the contact hole profiles 280b and 280c) without significantly impacting device performance.

With continued reference to FIG. 2, the sidewall spacers 221, 222 of the structure 200 are positioned adjacent to each of the gate electrodes 211, 212, respectively, in order to isolate the contact 280 from the gate electrodes 211, 212. These sidewall spacers may be multi-layered and can comprise a variety of dielectric materials, such as, for example, oxides, nitrides, low-k dielectrics, etc. Additionally, the sidewall spacers 221, 222 may also be tapered such that they are wider towards the bottom of the gate electrodes 211, 212 and narrower towards the top. Such tapered sidewall spacers allow the top surface 283 of the self-aligned lower portion 281 of the contact 280 to be formed wider than the bottom surface 284.

As described hereinabove, in each embodiment of the present disclosure the upper portion 282 of the contact 280 extends through at least one dielectric layer to the lower portion 281. For example, in one embodiment of the present disclosure the structure 200 can comprise a single dielectric layer (e.g., 252) above the gate electrodes 211, 212 and the lower portion 281 of the contact 280. In another embodiment of the present disclosure the structure 200 can comprise a dielectric stress layer 251 above the gate electrodes 211, 212 and the lower portion 281 of the contact 280 as well as another dielectric layer 252 above the stress layer 251.

The stress layer 251 can comprise a compressive nitride layer, a tensile nitride layer, or a dual-strain nitride layer and is used to optimize carrier mobility within the semiconductor structure devices (e.g., within the transistors comprising the gate electrodes 211, 212). Particularly, mechanical stress control of the channel regions may be used to enhance hole mobility in p-type MOSTFETs (p-FETs) and electron mobility n-type MOSFETs (n-FETs). For example, a compressive film over a p-FET structure enhances hole mobility to optimize p-FET performance. Alternatively, a tensile film over an n-FET structure enhances electron mobility to optimize n-FET performance. A dual-strain nitride layer is a nitride layer that has both tensile strain regions and compressive strain regions in order to simultaneously enhance carrier mobility in the channel regions of both n-FETs and p-FETs, respectively, on the same wafer.

Figure 3:
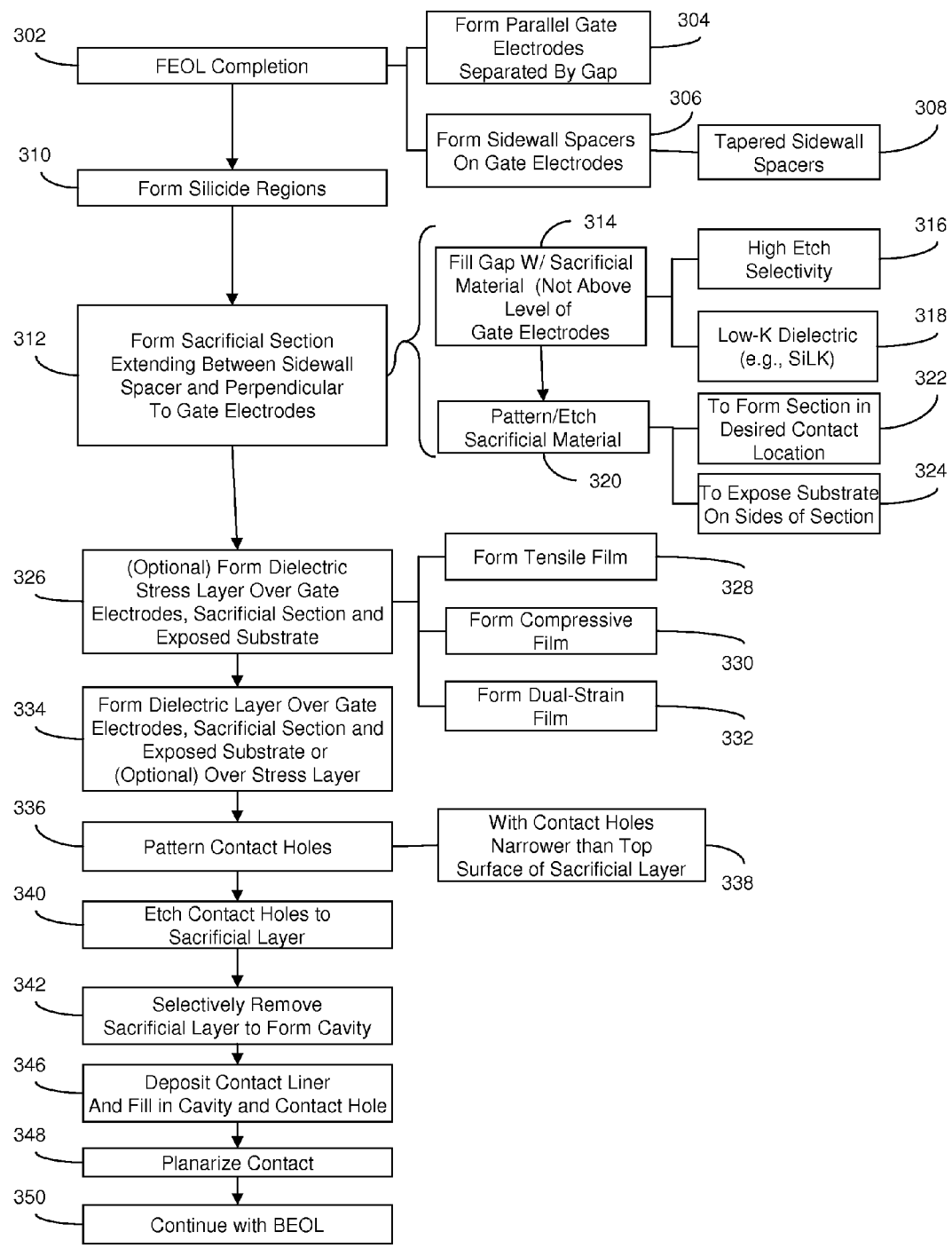
FIG. 3 is a flow diagram illustrating an embodiment of a method of forming a semiconductor structure in accordance with the present disclosure.
Figure 4:
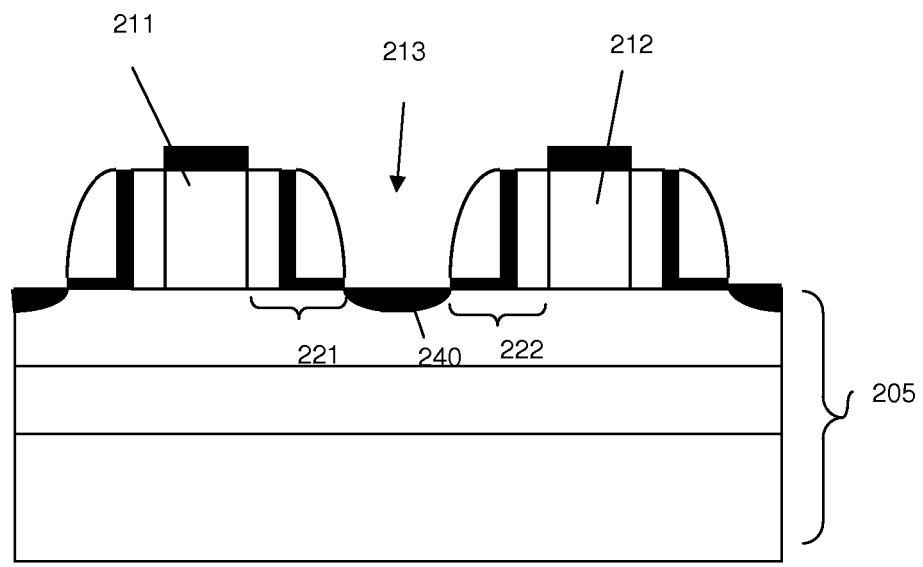
FIGS. 4 and 5 are schematic diagrams illustrating a cross-sectional view of a partially completed semiconductor structures of the present disclosure.

With reference to FIGS. 3-6, a method of forming a semiconductor structure in accordance with the present disclosure will now be discussed in detail. The embodiments of the method of forming the semiconductor structures, described above, comprise completing the front end of the line (FEOL) processing (302). Particularly, during the FEOL processing at least two parallel gate electrodes 211, 212 (i.e., gate electrode lines) are formed separated by a gap 213 on semiconductor substrate 205 (304), as illustrated in FIG. 4. In addition, sidewall spacers 221, 222 (e.g., oxide and/or nitride sidewall spacers) are formed adjacent to the gate electrodes 211, 212, respectively (306), as illustrated in FIG. 4. In particular, and as described herein below, tapered sidewall spacers may be formed so that the lower portion 281 of the contact 280, which is subsequently formed between these sidewall spacers 221, 222 using a self-aligned process, will be formed with a wider top surface 283 than bottom surface 284 (308). See FIG. 2. Additional FEOL processing can include, but is not limited to, doping the source/drain extensions, doping the source/drain diffusion regions, forming halos, etc.

With continued reference to FIGS. 3 and 4, a silicide region 240 is then formed on the semiconductor substrate 205 in the gap 213 between the gate electrodes 211, 212 (310, see FIG. 4). In particular, the silicide region 240 is formed (e.g., using conventional silicide formation processes) on the exposed portion of the semiconductor substrate 205 that extends between the sidewall spacers 221 and 222 that are adjacent to each of the gate electrodes 211, 212.

Figure 5:
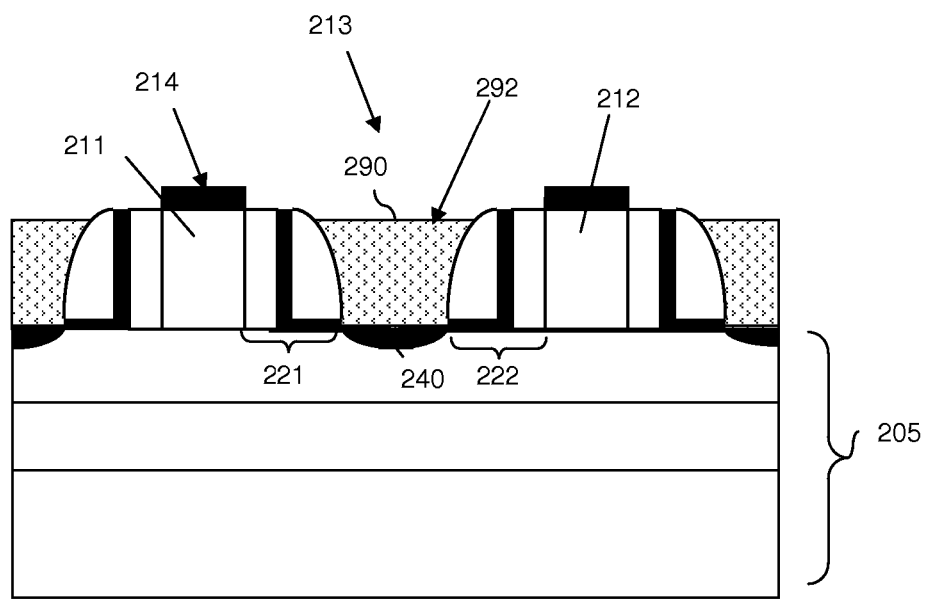

With reference to FIGS. 3 and 5, once the silicide region 240 is formed (at process 310), a sacrificial section 290 (i.e., a disposable plug, self-aligned disposable mandrel, etc.) is formed adjacent to the sidewall spacers 221, 222 in the gap 213 between the gate electrodes 211, 212 (312). In particular, the sacrificial section 290 is formed at a pre-selected location on the silicide region 240 where the contact 280 is to be formed (i.e., at a desired contact location). This sacrificial section 290 may be formed by filling the gap 213 between the electrodes 211, 212 with a sacrificial material (314). The sacrificial material must comprise a material that has a very high etch selectivity to the materials used to form the spacers 221, 222 and the subsequently formed dielectric layer(s) 251, 252 (316). For example, the sacrificial material may be a low-k constant (i.e., k<3) dielectric material (e.g., SiLK™) that has a very high etch selectivity to nitrides and/or oxides (318). The sacrificial material may be deposited, spun-on, etc. The sacrificial material may be self-planarizing or may be planarized and/or recessed so that that the top surface 292 of the sacrificial material is level with or below the top 214 of the gate electrodes 211, 212.

Figure 6:
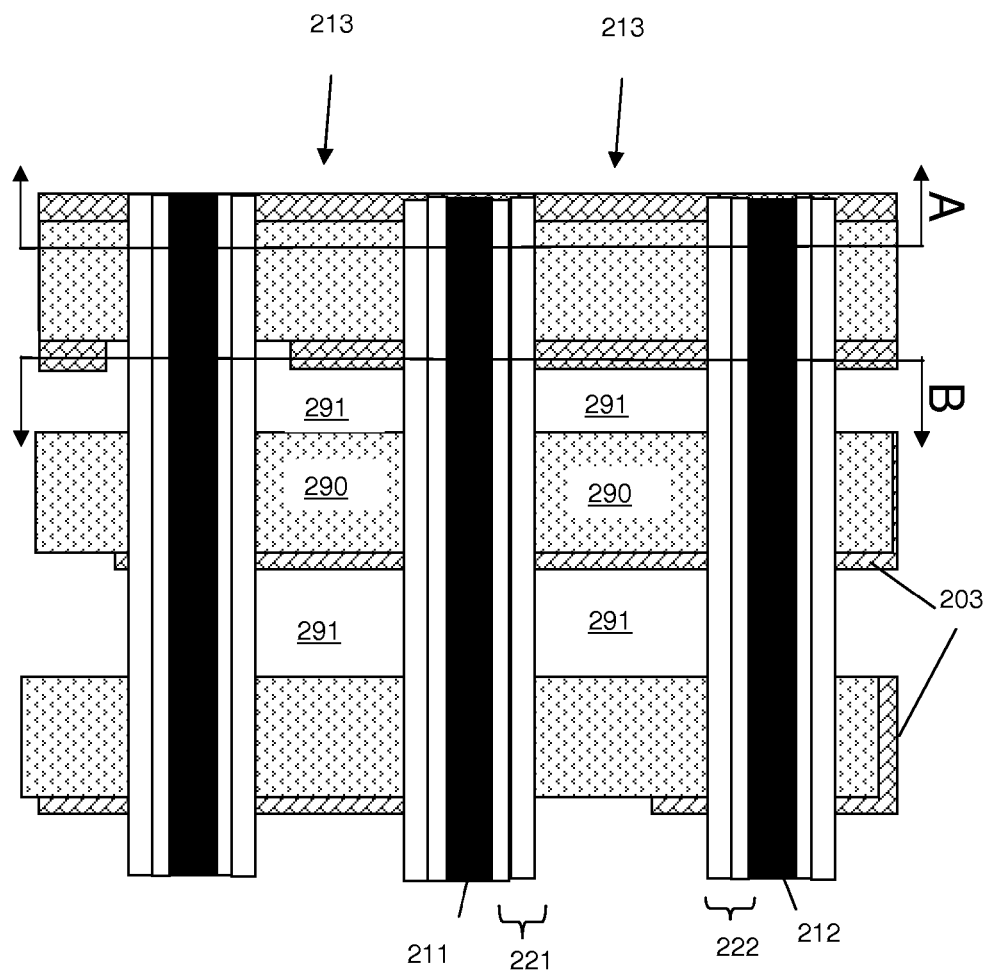
FIG. 6; is a top view of the partially completed structure of FIGS. 4 and 5.

With reference to FIGS. 3 and 6, once the gap 213 is filled (at process 316), the sacrificial material is patterned (e.g., lithographically patterned) (320) with a line/space feature. This line/space feature forms the sacrificial section 290 in the location of the semiconductor structure where the contact is to be positioned (322). This sacrificial material is particularly patterned so that the sacrificial section 290 extends within the gaps 213 between the sidewall spacers 221, 222, is perpendicular to the gate electrodes 211, 212 and is in a desired location for the contact 280. Additionally, the sacrificial material is patterned so that portions 291 of the semiconductor substrate 205 on either side of the sacrificial section 290 are exposed (324). Consequently, the sacrificial sections 290 and thus, the contact 280 locations are designed in a grid pattern.

After the sacrificial material is patterned to form the sacrificial section 290 (at process 312), at least one dielectric layer is formed over the gate electrodes, the sacrificial section and the exposed portions of the semiconductor substrate (326-334). For example, in one embodiment of the present disclosure a single dielectric layer 252 (e.g., interlayer dielectric) is formed over the gate electrodes 211, 212, the sacrificial section 290 and the exposed portions 291 of the semiconductor substrate 205 (334). In another embodiment of the present disclosure, an optional dielectric stress layer 251 (i.e., a middle of the line (MOL) stress liner) is first formed over the gate electrodes 211, 212, the sacrificial section 290 and the exposed portions 291 of the semiconductor substrate 205.

Figure 7:
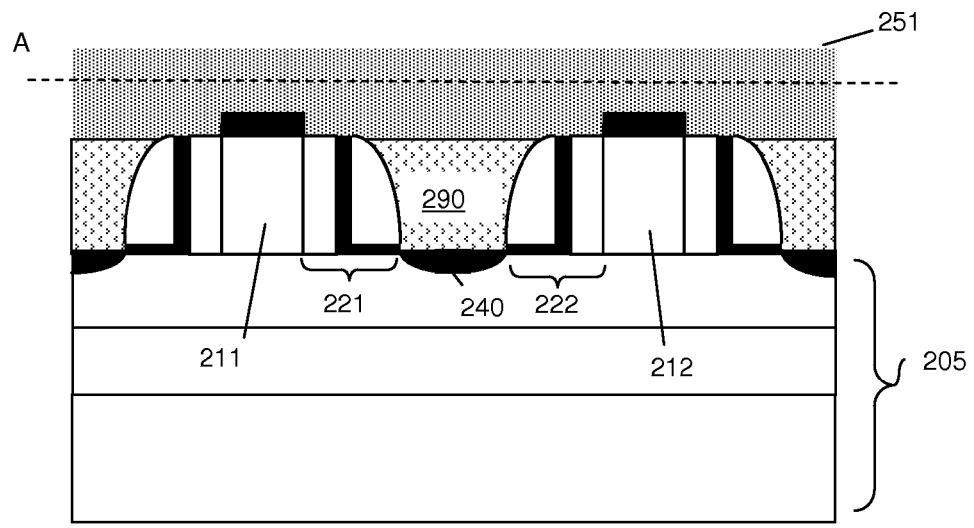
FIG. 7 is a schematic diagram illustrating a cross-sectional view taken along section line A of FIG. 6.
Figure 8:
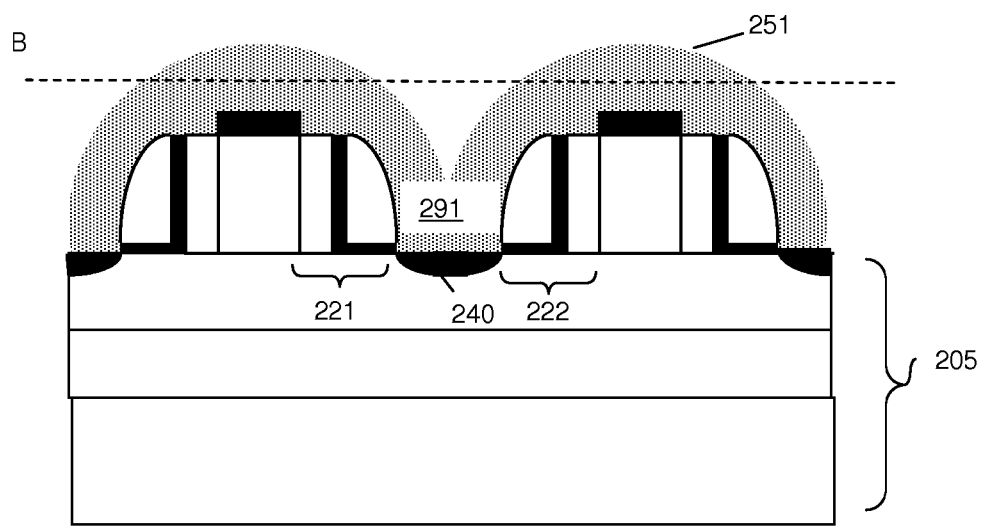
FIG. 8 is a schematic diagram illustrating a cross-sectional view taken along section line B of FIG. 6.

FIGS. 7 and 8 illustrate cross-sections A and B, respectively, of the structure of FIG. 6 following the deposition of an optional dielectric stress layer 251 (at process 324). Particularly, FIG. 7 illustrates the stress layer 251 over the electrodes 211, 212 and the sacrificial section 290. FIG. 8 illustrates the stress layer 251 on the electrodes 211, 212 and within the gap 213 on the exposed portions 291 of the substrate 205 on either side of the sacrificial section 290 (not shown). Thus, the sacrificial section 290 prevents deposition of the nitride layer 251 in the region of the semiconductor substrate 205 where the contact is to be formed.

Figure 9:
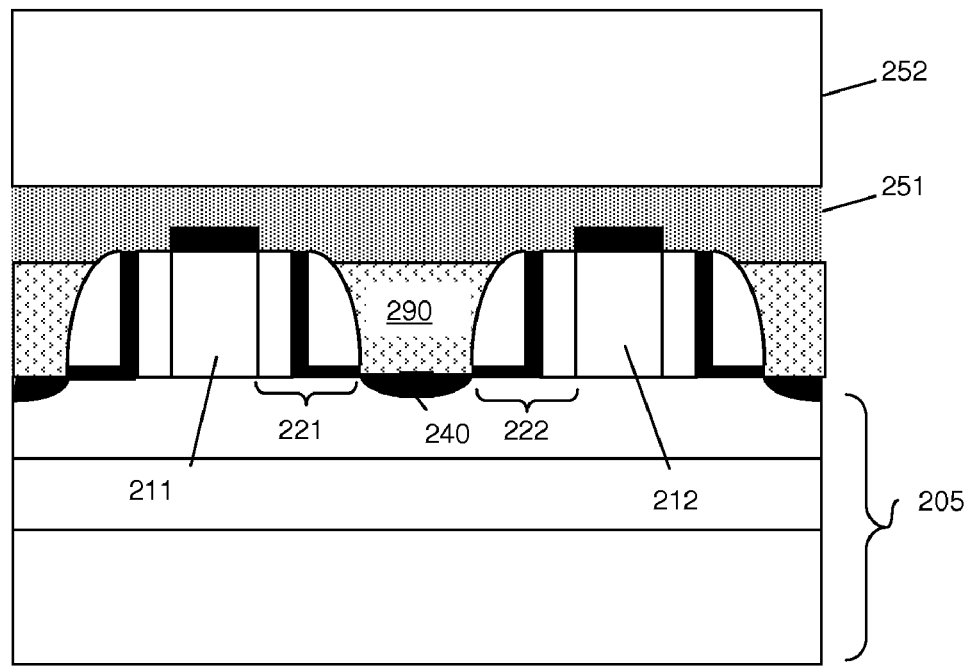
FIGS. 9-12 are schematic diagrams illustrating a cross-sectional view of a partially completed structure of the present disclosure.

The optional stress layer 251 may be used to apply mechanical stress to the channel regions of devices in the semiconductor structure (e.g., transistors that incorporate the gate electrodes 211, 212 and the semiconductor substrate 205) in order to enhance hole mobility in p-type MOSTFETs (p-FETs) or electron mobility n-type MOSFETs (n-FETs). In particular, known techniques may be used to form a compressive nitride layer (330), a tensile nitride layer (328) or a dual-strain nitride layer (332). Forming a compressive film over a p-FET structure enhances hole mobility to optimize p-FET performance. Forming a tensile film over an n-FET structure enhances electron mobility to optimize n-FET performance. Forming a dual-strain nitride layer that has both tensile strain regions and compressive strain regions can enhance mobility in both n-FETs and p-FETs that are formed on the same semiconductor substrate. With particular reference to FIG. 9 and with continued reference to FIG. 3, once the stress layer 251 is deposited, another dielectric layer 252 (e.g., an interlayer dielectric) may be formed (e.g., deposited and planarized) over the optional dielectric stress layer 251 (334).

Figure 10:
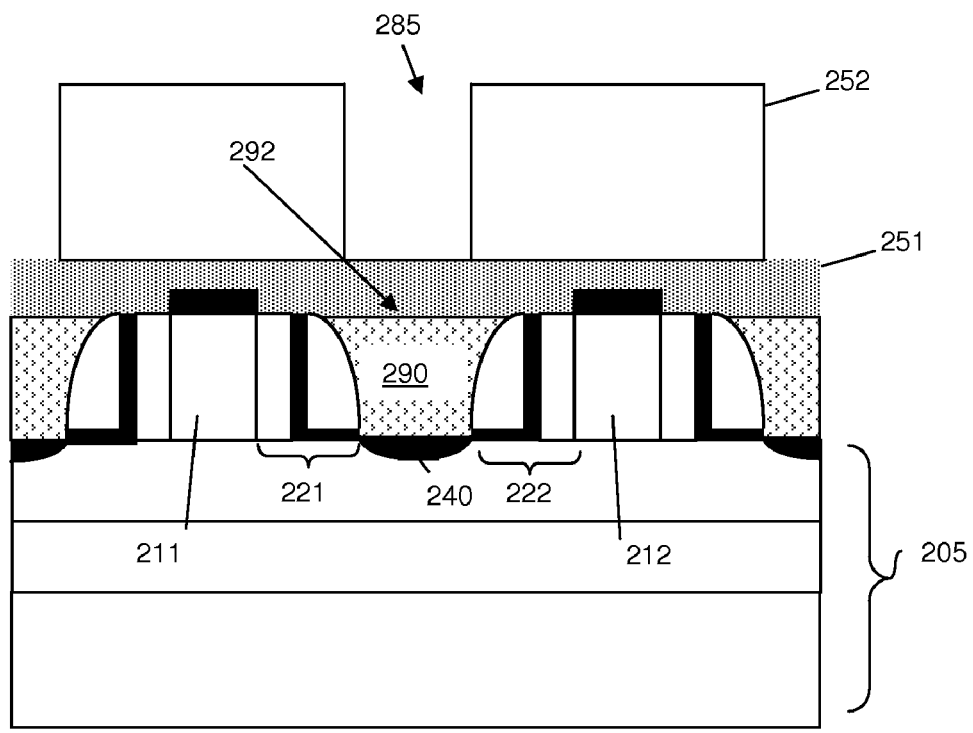
Figure 11:
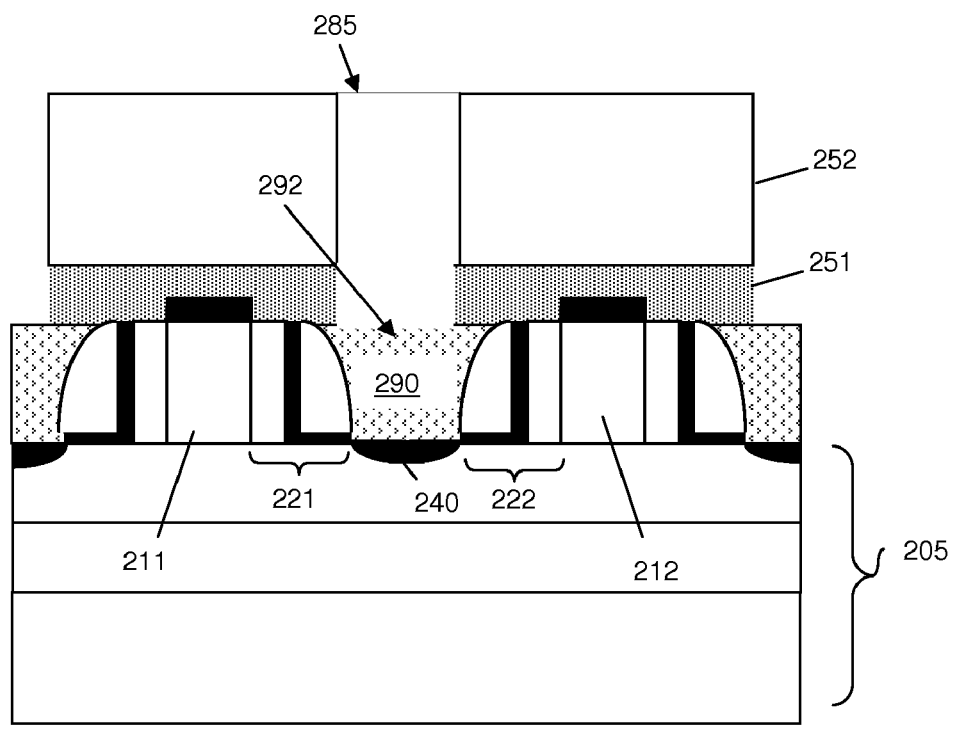

With reference to FIGS. 3, 10 and 11, after forming the dielectric layer(s) (at processes 326-334), a contact hole 285 is patterned (336-338) (e.g., using conventional contact lithography) and etched (e.g., by a conventional reactive ion etching (RIE) process) through the dielectric layer(s) 251, 252 to the top surface 292 of the sacrificial section 290 (340). The contact hole 285 may be particularly patterned so that it is narrower than the sacrificial section 290 and particularly, narrower than the top surface 292 of the sacrificial section 290. Thus, the sacrificial section 290 creates a landing pad for the contact hole 285 etch process that is wider than the contact hole and thereby provides a greater tolerance for over etching. If multiple dielectric layers (e.g., a dielectric stress layer 251 and another dielectric layer 252) were previously formed (at process 326-334), this etching process may require multiple stages designed to selectively etch through each of the dielectric layers 251, 252.

Figure 12:
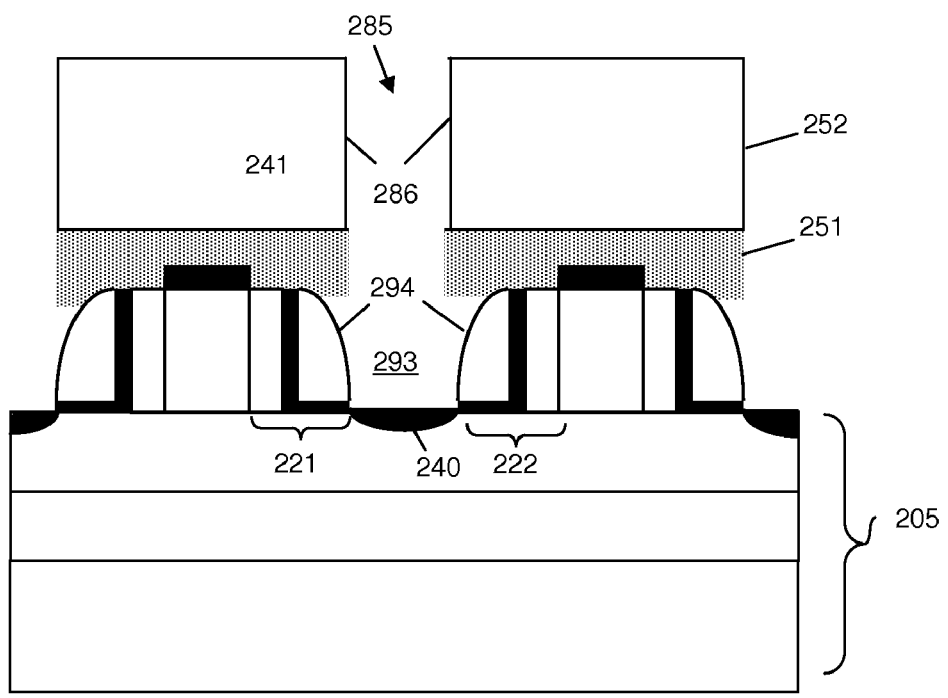

Once the top surface 292 of the sacrificial section 290 is exposed, the sacrificial section 290 is selectively removed forming a cavity 293 and exposing the silicide region 240 without removing or damaging the surrounding dielectrics (e.g., the dielectric materials used to form the sidewall spacers 221, 222 and the dielectric layer(s) 251, 252) (342). See FIG. 12. For example, if SiLK™ is used to form the sacrificial section 290, the sacrificial section 290 may be ashed out using a selective plasma etch process.

Once the silicide region 240 is exposed and the cavity 293 is formed, the contact 280 is formed (346-348) by forming an optional conductive contact liner (e.g., a titanium nitride liner) against the outer surfaces 294 of the cavity 293 (i.e., the surfaces that were exposed by removing the sacrificial section 290, such as the silicide region 240, the sidewall spacers 221, 222, etc.) and the sidewalls 286 of the contact hole 285. Then, a conductive fill material (e.g., a metal, such as tungsten or copper) is deposited (e.g., using a high-aspect-ratio fill or plating method) through the contact hole 285 until the cavity 293 and contact hole 285 are filled. Thus, as illustrated in FIG. 2, a lower self-aligned portion 281 of the contact 280 is formed between sidewall spacers 221, 222 that are adjacent to each of the gate electrodes 211, 212 and an upper portion 282 is formed within the contact hole 285 above the lower portion 281 using conventional RIE lithography. By self-aligning the lower portion 281 of the contact 280, this method both maximizes the contact area between the contact 280 and the silicide region 240 so as to minimize contact resistance and eliminates the junction leakage found in typical contacts resulting from contact etch through the sidewall spacers adjacent to the gate electrodes. The method also allows for line/ space lithography of the lower portion 281 of the contact, thereby, increasing lithography fidelity. Additionally, as described hereinabove, if the sidewall spacers 221, 222 are tapered, this self-aligned process ensures that the top surface 283 of the lower portion 281 of the contact 280 is wider than the bottom surface 284. The wider top surface 283 not only decreases contact resistance but also improves the RIE process margin for the upper portion 282 of the contact since there is a larger landing pad for the etch process and thus, little, if any, over etch of the gate sidewall spacers. Following contact liner and fill deposition (at process 346) and contact planarization (at process 348), back end of the line (BEOL) processing continues to interconnect the active components (transistors, resistors, etc.) on the substrate with wiring, etc.

Therefore, disclosed above are embodiments of a semiconductor structure with a partially self-aligned contact integration scheme in which the diameter of the lower portion of the contact is significantly enlarged to reduce resistance. Since the contact is self-aligned to gate electrodes, the size expansion does not intrinsically impact device yield. Additionally, an embodiment of the structure allows for the integration of a thick middle-of-the-line (MOL) nitride stress film to enhance carrier mobility. Embodiments of the method of forming the structure comprise forming a sacrificial section (i.e., a disposable plug) in the intended location of the contact. This plug is patterned so that it is self-aligned to the gate electrodes and only occupies space that is intended for the future contact. Dielectric layer(s) (e.g., an optional stress layer followed by an interlayer dielectric) may be deposited once the sacrificial section is in place. Conventional contact lithography is used to etch a contact hole through the dielectric layer(s) to the sacrificial section. The sacrificial section is, then, selectively removed to form a cavity and the contact is formed in the cavity and contact hole.

While the present disclosure has been described in terms of preferred embodiments, those skilled in the art will recognize that the present disclosure may be practiced with modification within the spirit and scope of the appended claims.

What is claimed is:

1. A method of forming a semiconductor structure, said method comprising:

forming, on a semiconductor substrate, a first gate electrode and a second gate electrode positioned laterally relative to said first gate electrode;

forming a first sidewall spacer adjacent to said first gate electrode and a second sidewall spacer adjacent to said second gate electrode such that said first sidewall spacer and said second sidewall spacer are separated by a gap;

forming a silicide region on said semiconductor substrate within said gap and extending laterally from said first sidewall spacer to said second sidewall spacer;

forming a sacrificial section on said silicide region, said sacrificial section extending laterally from said first sidewall spacer to said second sidewall spacer and filling said gap such that side edges of said sacrificial section follow contours of said first sidewall spacer and said second sidewall spacer and a top surface of said sacrificial section is approximately level with top surfaces of said first gate electrode and said second gate electrode;

forming a dielectric layer above said first gate electrode, said first sidewall spacer, said sacrificial section, said second sidewall spacer and said second gate electrode;

forming a contact hole through said dielectric layer to said sacrificial section;

selectively removing said sacrificial section to form a cavity and expose said silicide region, said first sidewall spacer and said second sidewall spacer; and depositing a conductive material into said cavity and said contact hole so as to form a contact comprising:

a self-aligned lower portion on said silicide region, said self-aligned lower portion extending laterally from said first sidewall spacer to said second sidewall spacer and filling said cavity such that side edges of said self-aligned lower portion contact and follow said contours of said first sidewall spacer and said second sidewall spacer; and an upper portion on said self-aligned lower portion filling said contact hole within said dielectric layer, wherein a bottom surface of said self-aligned lower portion is adjacent to said silicide region and a top surface of said self-aligned lower portion is adjacent to said upper portion and is further approximately level with said top surfaces of said first gate electrode and said second gate electrode.

2. The method of claim 1, wherein said forming of said sacrificial section comprises forming said sacrificial section in a preselected location on said silicide region where said contact is subsequently to be formed.

3. The method of claim 1, wherein said forming of said sacrificial section comprises:

filling said gap with a sacrificial material so that said sacrificial material does not extend above said first gate electrode and said second gate electrode; and patterning said sacrificial material so that said sacrificial section extends laterally between said first sidewall spacer and said second sidewall spacer perpendicular to said first gate electrode and said second gate electrode and so that, on sides of said sacrificial section not adjacent to said first sidewall spacer and said second sidewall spacer, portions of said semiconductor substrate are exposed.

4. The method of claim 1, wherein said sacrificial section is formed with a low-k dielectric material, where k is less than 3.0.

5. The method of claim 1, wherein said contact hole is formed narrower than said top surface of said sacrificial section.

6. The method of claim 1, wherein said forming of said first sidewall spacer and said second sidewall spacer comprise forming tapered sidewall spacers so that, when said self-aligned lower portion of said contact is subsequently formed, said top surface of said self-aligned lower portion is wider than said bottom surface.

7. A method of forming a semiconductor structure, said method comprising:

forming, on a semiconductor substrate, a first gate electrode and a second gate electrode positioned laterally relative to said first gate electrode;

forming a first sidewall spacer adjacent to said first gate electrode and a second sidewall spacer adjacent to said second gate electrode such that said first sidewall spacer and said second sidewall spacer have tapered contours and are separated by a gap;

forming a silicide region on said semiconductor substrate within said gap and extending laterally from said first sidewall spacer to said second sidewall spacer;

forming a sacrificial section on said silicide region, said sacrificial section extending laterally from said first sidewall spacer to said second sidewall spacer and filling said gap such that side edges of said sacrificial section follow said tapered contours of said first sidewall spacer and said second sidewall spacer and a top surface of said sacrificial section is approximately level with top surfaces of said first gate electrode and said second gate electrode;

forming a dielectric layer above said first gate electrode, said first sidewall spacer, said sacrificial section, said second sidewall spacer and said second gate electrode;

forming a contact hole through said dielectric layer to said sacrificial section;

selectively removing said sacrificial section to form a cavity and expose said silicide region, said first sidewall spacer and said second sidewall spacer; and depositing a conductive material into said cavity and said contact hole so as to form a contact comprising:

a self-aligned lower portion on said silicide region, said self-aligned lower portion extending laterally from said first sidewall spacer to said second sidewall spacer and filling said cavity such that side edges of said self-aligned lower portion contact and follow said tapered contours of said first sidewall spacer and said second sidewall spacer; and an upper portion on said self-aligned lower portion filling said contact hole within said dielectric layer, wherein a bottom surface of said self-aligned lower portion is adjacent to said silicide region and a top surface of said self-aligned lower portion is adjacent to said upper portion and is further approximately level with said top surfaces of said first gate electrode and said second gate electrode.

8. The method of claim 7, wherein said forming of said sacrificial section comprises forming said sacrificial section in a preselected location on said silicide region where said contact is subsequently to be formed.

9. The method of claim 7, wherein said forming of said sacrificial section comprises:
filling said gap with a sacrificial material so that said sacrificial material does not extend above said first gate electrode and said second gate electrode; and
patterning said sacrificial material so that said sacrificial section extends laterally between said first sidewall spacer and said second sidewall spacer perpendicular to said first gate electrode and said second gate electrode and so that, on sides of said sacrificial section not adjacent to said first sidewall spacer and said second sidewall spacer, portions of said semiconductor substrate are exposed.

10. The method of claim 7, wherein said sacrificial section is formed with a low-k dielectric material, where k is less than 3.0.

11. The method of claim 7, wherein said contact hole is formed narrower than said top surface of said sacrificial section.

12. The method of claim 7, wherein said tapered contours ensure that, when said self-aligned lower portion of said contact is subsequently formed, said top surface of said self-aligned lower portion is wider than said bottom surface.

13. A method of forming a semiconductor structure, said method comprising:
forming, on a semiconductor substrate, a first gate electrode and a second gate electrode positioned laterally relative to said first gate electrode;
forming a first sidewall spacer adjacent to said first gate electrode and a second sidewall spacer adjacent to said second gate electrode such that said first sidewall spacer and said second sidewall spacer are separated by a gap;
forming a sacrificial section extending laterally from said first sidewall spacer to said second sidewall spacer and filling said gap such that side edges of said sacrificial section follow contours of said first sidewall spacer and said second sidewall spacer and a top surface of said sacrificial section is approximately level with top surfaces of said first gate electrode and said second gate;
forming a dielectric layer above said first gate electrode, said first sidewall spacer, said sacrificial section, said second sidewall spacer and said second gate electrode;
etching a contact hole through said dielectric layer to said sacrificial section;
selectively removing said sacrificial section to form a cavity and expose said first sidewall spacer and said second sidewall spacer; and
depositing a conductive material into said cavity and said contact hole so as to form a contact comprising:
a self-aligned lower portion extending laterally from said first sidewall spacer to said second sidewall spacer and filling said cavity such that side edges of said self-aligned lower portion contact and follow said contours of said first sidewall spacer and said second sidewall spacer; and
an upper portion on said self-aligned lower portion filling said contact hole within said dielectric layer, wherein a top surface of said self-aligned lower portion is adjacent to said upper portion and is further approximately level with said top surfaces of said first gate electrode and said second gate electrode.

14. The method of claim 13, wherein said forming of said sacrificial section comprises forming said sacrificial section in a preselected location where said contact is subsequently to be formed.

15. The method of claim 13, wherein said forming of said sacrificial section comprises:
filling said gap with a sacrificial material so that said sacrificial material does not extend above said first gate electrode and said second gate electrode; and
patterning said sacrificial material so that said sacrificial section extends laterally between said first sidewall spacer and said second sidewall spacer perpendicular to said first gate electrode and said second gate electrode and so that, on sides of said sacrificial section not adjacent to said first sidewall spacer and said second sidewall spacer, portions of said semiconductor substrate are exposed.

16. The method of claim 13, wherein said sacrificial section is formed with a low-k dielectric material, where k is less than 3.0.

17. The method of claim 13, wherein said contact hole is formed narrower than said top surface of said sacrificial section.

18. The method of claim 13, wherein said forming of said first sidewall spacer and said second sidewall spacer comprise forming tapered sidewall spacers so that, when said self-aligned lower portion of said contact is subsequently formed, said top surface of said self-aligned lower portion is wider than said bottom surface.

* * * * *